(12) United States Patent
Lee et al.

(10) Patent No.: US 10,574,254 B2
(45) Date of Patent: *Feb. 25, 2020

(54) HYBRID FLASH ARCHITECTURE OF SUCCESSIVE APPROXIMATION REGISTER ANALOG TO DIGITAL CONVERTER

(71) Applicant: Avnera Corporation, Beaverton, OR (US)

(72) Inventors: Wai Lee, Portland, OR (US); Jianping Wen, Tigard, OR (US); Garry N. Link, Pacific City, OR (US)

(73) Assignee: Avnera Corporation, Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/173,398

(22) Filed: Oct. 29, 2018

(65) Prior Publication Data

US 2019/0173482 A1 Jun. 6, 2019

Related U.S. Application Data

(63) Continuation of application No. 15/853,779, filed on Dec. 23, 2017, now Pat. No. 10,148,280.

(60) Provisional application No. 62/438,931, filed on Dec. 23, 2016.

(51) Int. Cl.
| | | |
|---|---|---|
| *H03M 1/46* | (2006.01) | |
| *H03M 1/44* | (2006.01) | |
| *H03M 1/10* | (2006.01) | |
| *H03M 1/18* | (2006.01) | |

(52) U.S. Cl.
CPC ......... *H03M 1/462* (2013.01); *H03M 1/1033* (2013.01); *H03M 1/447* (2013.01); *H03M 1/188* (2013.01); *H03M 1/468* (2013.01)

(58) Field of Classification Search
CPC .... H03M 1/462; H03M 1/1033; H03M 1/447; H03M 1/188
USPC ......................................... 341/155, 144, 161
See application file for complete search history.

(56) References Cited

U.S. PATENT DOCUMENTS

| | | | | |
|---|---|---|---|---|
| 9,425,814 | B1* | 8/2016 | Verma | .................... H03M 7/165 |
| 9,866,231 | B2* | 1/2018 | Le | ......................... H03M 1/0604 |
| 9,871,529 | B1* | 1/2018 | Chong | .................... H03M 1/38 |
| 9,906,232 | B1* | 2/2018 | Cho | .................... H04L 27/0002 |
| 2018/0183458 | A1 | 6/2018 | Lee et al. | |

* cited by examiner

*Primary Examiner* — Brian K Young
(74) *Attorney, Agent, or Firm* — Knobbe, Martens, Olson & Bear, LLP (57) ABSTRACT

The disclosure includes a mechanism for mitigating electrical current leakage in a Successive Approximation Register (SAR) Analog to Digital Converter (ADC) by using a Flash ADC in conjunction with the SAR ADC. A sequence controller in the SAR ADC uses the output of the Flash ADC to control a switch array. Depending on the output of the Flash ADC, the sequence controller can control the switch array to couple at least one capacitor in the capacitor network of the SAR ADC to a voltage that reduces charge leakage in the SAR ADC. The voltage may be a pre-defined positive or negative reference voltage.

20 Claims, 5 Drawing Sheets

HYBRID FLASH ARCHITECTURE OF SUCCESSIVE APPROXIMATION REGISTER ANALOG TO DIGITAL CONVERTER

CROSS-REFERENCES TO RELATED APPLICATIONS

The present application is a continuation of U.S. application Ser. No. 15/853,779, filed on Dec. 23, 2017 and titled "Hybrid Flash Architecture of Successive Approximation Register Analog to Digital Converter," which is hereby incorporated by reference in its entirety, and which claims benefit from U.S. Provisional Patent Application Ser. No. 62/438,931, filed Dec. 23, 2016,and entitled "Hybrid Flash Successive Approximation Register ADC Architecture" which is incorporated herein by reference as if reproduced in its entirety.

BACKGROUND

Analog to Digital Converters (ADCs) are employed in many technological areas. For example, an ADC may be employed to convert sound entering a microphone into a digital signal that can be stored and processed by a digital computing system. The ADC then converts the sample into a corresponding digital value. Certain ADCs employ capacitors to sample an analog signal. A Successive Approximation Register (SAR) is one type of ADC, which may be formed by integrated circuits. As integrated circuits shrink, however, SAR circuits may exhibit electrical current loss in the form of increased relative channel leakage due to the low threshold voltage of particular sampling switches coupled to the capacitor array of the SAR. Channel leakage is nonlinear compared to signal levels, and therefore this introduces noise distortion to a SAR ADC, which is to be avoided. Other current losses occur when the capacitors of the SAR capacitor network leak current through a comparator, or through other SAR circuit components.

Embodiments of the disclosure address these and other limitations.

BRIEF DESCRIPTION OF THE DRAWINGS

Aspects, features and advantages of embodiments of the present disclosure will become apparent from the following description of embodiments in reference to the appended drawings in which.

DETAILED DESCRIPTION

As noted above, a SAR implemented as an integrated circuit may have undesirable noise characteristics. A typical SAR ADC employs an array of capacitors to sample an analog signal. The SAR ADC approximates the sample by successfully comparing an amount of charge stored on the capacitor array to reference connection(s). The initial charge stored on the capacitor array is derived from and directly related to the analog signal to be converted. Some SAR ADCs also inject inverted charge values by connecting a capacitor to a negative reference connection. This allows values to be subtracted during certain operations. Ideally during successive approximation cycles, no direct electrical path exists from floating top plates of the capacitor array to any other node. When true, the sampled charges are preserved towards the end of the ADC conversion and the final sample coding faithfully reflects the sampled analog signal. As integrated circuits become smaller, however, electrical current leakage paths become relatively more prominent. For example, when the sampled voltage is relatively large, the capacitor network tends to leak electrical charge through sampling switches. Since the amount of leakage is exponentially related to the sampled signal and is temperature dependent, the leakage exhibits as nonlinear error that cannot be corrected. Another leakage path exists between the capacitors of the array and a comparator, which, when formed in a Metal Oxide Semiconductor (MOS) process has a relatively large gate area. As integrated circuits shrink and dielectric materials between the gate and substrate become thinner, relatively more electrical charge can leak from the capacitor array through the dielectric material, providing yet another leakage path.

Disclosed herein is a SAR ADC designed to reduce this distortion by limiting a maximum differential voltage between the floating top plates of the capacitor array and other circuit components of the SAR, such as a comparator and sampling switches.

Figure 1:
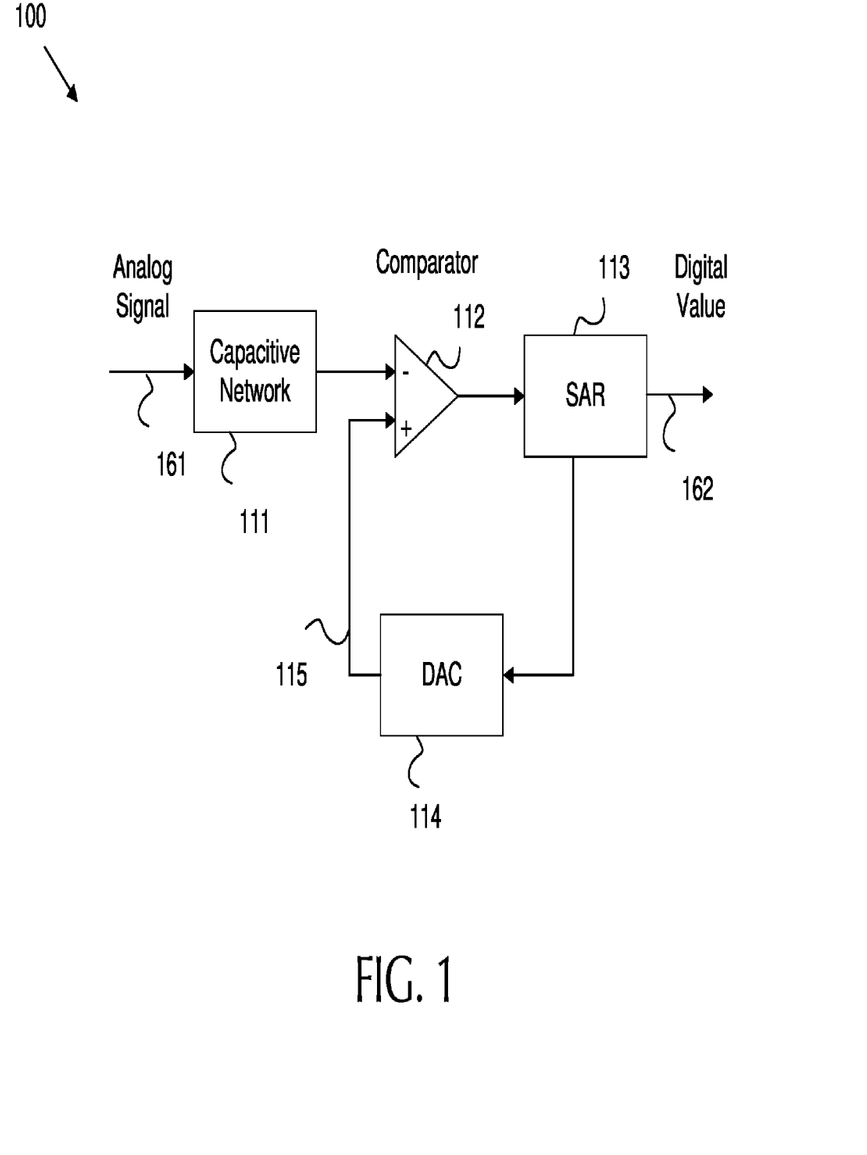
FIG. 1 is a schematic diagram of an example Successive Approximation Register (SAR) Analog to Digital Converter (ADC) architecture.

FIG. 1 is a schematic diagram of an example SAR ADC 100 architecture. The SAR ADC 100 includes a capacitive network 111, a comparator 112, a SAR 113, and a Digital to Analog Converter (DAC) 114 coupled as illustrated. The capacitive network 111 is coupled to an incoming analog signal 161. The capacitors store charge from the analog signal 161 as a sample of the analog signal at a discrete instance in time. The SAR 113 may include a register for storing digital data as well as a circuit for providing known reference values. The DAC 114 may be any device capable of converting a digital value to a corresponding analog signal value. The SAR 113 is configured to forward a known reference value (e.g. a one, a zero, etc.) via the DAC 114 to the comparator 112 for each bit of the sample. The reference values are communicated to the comparator over a reference connection 115. The comparator 112 is any electronic device capable of comparing two voltages and outputting an indication of which voltage is larger. The comparator 112 receives both voltage from the sample in the capacitive network 111 and the known value from the SAR 113 via the DAC 114. The comparator 112 then indicates which value is larger. The result of the comparison is stored in the SAR 113 as a bit of a corresponding digital value 162.

As such, the DAC 114 is a capacitor DAC including an array of capacitors to generate comparison voltages for each bit desired in the digital value 162. The SAR ADC 100 may then iteratively test the sampled input voltage from the capacitive network 111 against the known value from the SAR 113 on a bit by bit basis. The results are stored in the SAR 113. Once all the desired bits have been tested, the resulting digital value 162 may be forwarded from the SAR ADC 100 for further use by coupled systems.

Figure 2:
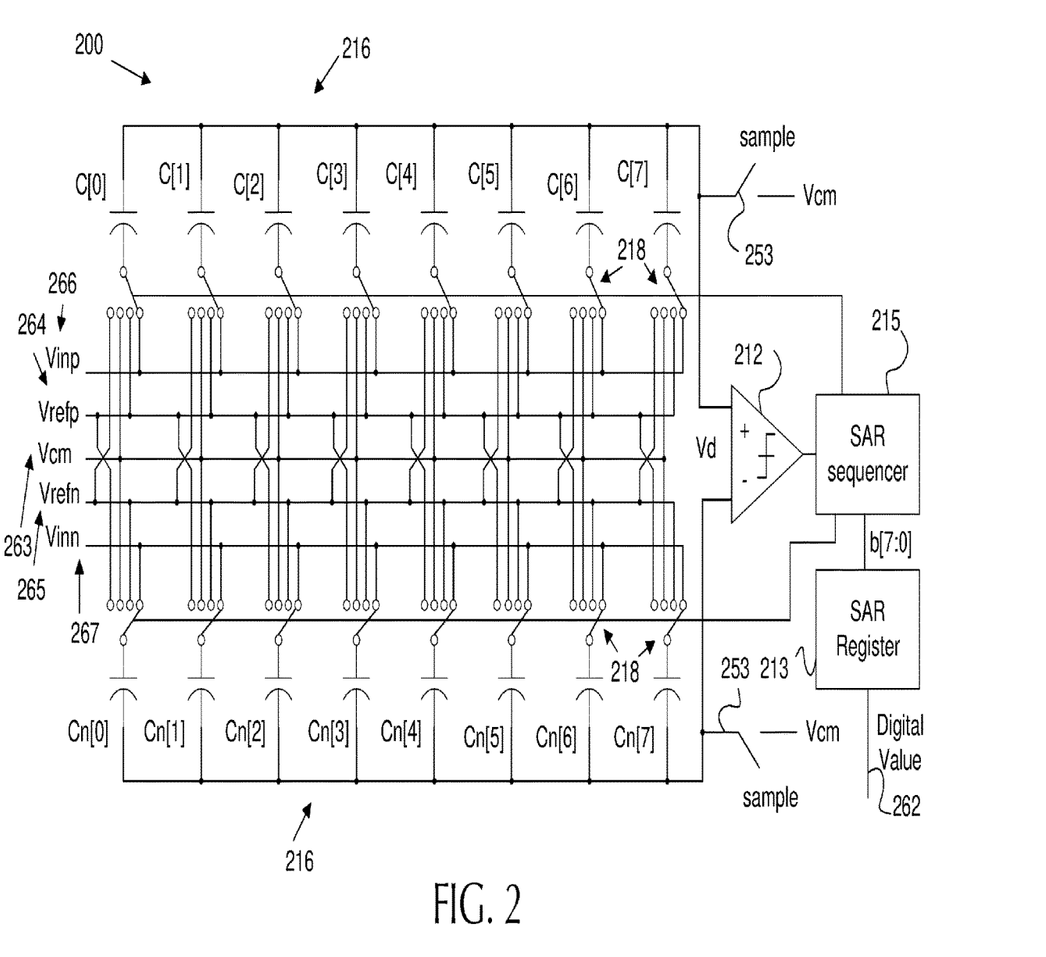
FIG. 2 is a schematic diagram of an example capacitor network for a SAR ADC.

FIG. 2 is a schematic diagram of an example SAR ADC 200. The SAR ADC includes a capacitor network 216 that combines the functions of the capacitor network 111 and DAC 114 in FIG. 1. The capacitor network 216 is selectively coupled to an analog input voltage and to various reference voltages. A SAR sequencer 215 controls operation of switches 218 coupled to various capacitors C[0], C[1], . . . C[n]. In this example, n=7 as the SAR ADC 200 outputs an 8-bit digital value. Of course, larger or smaller capacitor networks may also be used in embodiments of the invention. Some capacitor networks 216 include two sets of capacitors and therefore the capacitors C[0], C[1], . . . C[n] have counterparts Cn[0], Cn[1], . . . Cn[n] that operate as described below.

The capacitor network 216 is coupled to a comparator 212, which is used to compare a Vd voltage against a reference voltage to determine the higher voltage. Output from the comparator 212 is fed to a SAR sequencer 215, which locally stores the output before passing it, bitwise, to a SAR register 213. The SAR register 213 may include error correction logic, as described below, to ensure that the SAR ADC 200 accurately converts the analog input signal to the correct digital output value 262.

In a SAR ADC, the accuracy of comparator decisions for each bit directly depends on the accuracy of a reference voltage. The capacitor network 216 of FIG. 2 employs a balance ternary encoding architecture. The individual capacitors of network 216 couple to the comparator 212 via switches 218. The switches are controlled by the SAR sequencer 215, and the particular switch control depends on the signal being sampled. The capacitor network 216 receives a common mode reference voltage (Vcm) 263, a positive input voltage (Vinp) 266, a negative input voltage (Vinn) 267, a positive reference voltage (Vrefp) 264, and a negative reference voltage (Vrefn) 265.

The analog input signal to be converted to the digital output 262 by the SAR ADC is fed to the capacitor network 216 in the form of a differential signal Vinp 266 and Vinn 267 that is centered around a common mode signal Vcm 363. In operation, the capacitors 316 are charged by the differential analog signal received over Vinp 366 and Vinn 367 until a sample is captured. Vcm 363 provides a nominal voltage (e.g. representing a zero value), Vrefp 364 provides a positive voltage (e.g. representing a value of positive one for the particular bit being measured at the comparator 212), and Vrefn 365 provides a negative voltage (e.g. representing a value of negative one for the particular bit being measured at the comparator 212). Capacitors 216 can be switched to Vcm 263 to determine an actual value or switched to Vrefp 264 and/or Vrefn 265 as desired to invert charge values to support subtraction operations.

The capacitors of the capacitor network 216 may be coupled directly to the comparator 212. Before the comparator 212 makes decision for a bit value, the bottom plates of the capacitors corresponding to that bit are connected to a common mode reference (Vcm) 363. For purposes of clarity, it should be noted that the bottom plates are the capacitor 216 plates coupled to the switches 218 and top plates are capacitor 216 plates coupled to the comparator 212. After the decision of a particular bit is made, the bottom plates of the capacitors corresponding to the decision bit are switched from Vcm 263 to reference Vrefp 264 and Vrefn 265, respectively. Charge flow from reference to the capacitor 216 arrays perturb reference lines. Further, the operation of the switches 218 inject charge into the connections, which further perturb the reference lines.

In operation, before successive approximation starts, the capacitor network 216 is reset by coupling both the bottom plates and the top plates of the capacitors to the common mode voltage Vcm 263. The bottom plates are coupled through switches 218 and the top plates are coupled through switches 253. Next, the analog input is sampled and stored on the capacitor network 216. The sampling process begins with the input signal received over Vinp 366 and Vinn 367 being coupled to the bottom plates of the capacitors in the capacitor network 216 through operation of the switches 218. In the sampling phase, the top plates of the capacitors in the capacitor network 216 remain coupled to the common mode voltage Vcm 263 through the switches 253. This samples the analog input signal into the capacitor network 216. At the end of the sampling phase, the switches 253 open to decouple the top plates from the Vcm 263 and the bottom plates are again coupled to Vcm 263. Thus, with the input sample stored as a sampled charge in the capacitor network 216, and the bottom plates of the capacitors switched to Vcm, the Vd voltage goes to the inverse of the input voltage in preparation for the first comparator decision. Although at the end of the sampling phase the top plates of the capacitors 216 are not coupled to any other node of the SAR ADC 200, in practice, however, the switches 253 leak electrical current. Further current leaks from the top plates of the capacitor 216 through the gate dielectric of the transistors making up the comparator 212. The amount of leakage increases exponentially with Vd voltage and temperature. There may be other leakage paths as well.

The capacitors in the capacitor network 216 include a pair of Most Significant Bit (MSB) capacitors C[7], Cn[7], as well as a pair of Least Significant Bit (LSB) capacitors C[0], Cn[0]. The remaining capacitors are called intermediate bit capacitors. The MSB capacitors C[7], Cn[7] are the largest capacitors and hold the most charge, with each successive capacitor C[x], Cn[x] holding less charge until the LSB capacitor C[0], Cn[0] (e.g. the smallest capacitors with the smallest charge capacity). Any number of capacitors 216 may be used depending on the desired number of bits for the digital value 462. The capacitors 416 are depicted in terms of k, where k indicates a current bit capacitor 416 being compared, k+1 indicates a previously compared bit capacitor 416, k−1 indicates a next bit capacitor 416 to be compared, etc.

Because of their relative large size, and because they hold the most amount of charge, the MSB capacitors C[7], Cn[7], and, to some extent, all of the larger-sized capacitors, may carry charge that can inhibit the performance of the SAR ADCs because of the leakage paths described above.

Figure 3:
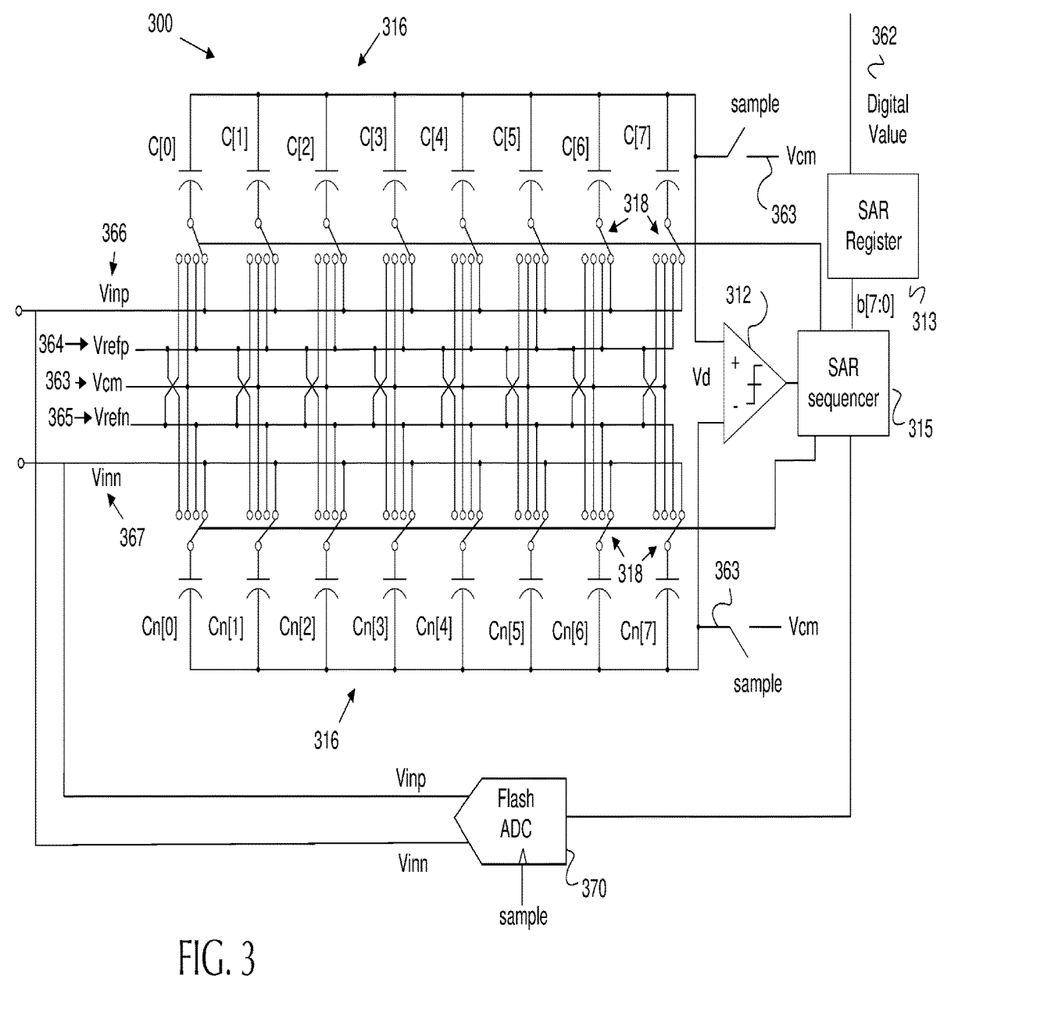
FIG. 3 is a schematic diagram of an example capacitor network for a hybrid SAR ADC that includes a flash ADC according to embodiments of the invention.

FIG. 3 is a schematic diagram of an example capacitor network for a hybrid SAR ADC that includes a flash ADC according to embodiments of the invention. In addition to the components illustrated in the SAR ADC 200 of FIG. 2, a SAR ADC 300 of FIG. 3 further includes a Flash Analog to Digital Converter (Flash ADC) 370. A Flash ADC is so named because of its relative speed—it produces a digital approximation output of an analog input voltage very quickly. Flash ADCs are typically architected using a resistor ladder to generate reference voltages to a set of comparators. The other input to each comparator is coupled to the input voltage. Then, the analog input voltage is measured against each sensed voltage of the resistor ladder simultaneously. Through combination logic, the outputs of the comparators may be logically combined to produce a binary coded output.

In FIG. 3, the Flash ADC 370 has inputs coupled to the analog input signals on Vinp 366 and Vinn 367. The output is coupled to the SAR sequencer 315. In operation, during the sampling phase, the Flash ADC 370 encodes the input signal as the input signal is also being stored into the capacitor array 316. But, because the Flash ADC 370 generates an output very quickly, the output is sent to the SAR sequencer 315 at the end of the sampling phase, even before the successive approximation phase starts. In some embodiments the Flash ADC 370 generates an output within 2 ns of receiving the inputs.

In some embodiments the Flash ADC 370 encodes two MSBs and passes them to the SAR sequencer 315, while in other embodiments the Flash ADC encodes just one MSB in which case the Flash ADC reduces to a single comparator determining the polarity of the input signal at the time of input signal sampling. Embodiments of the invention are operable with a Flash ADC encoding any number of bits, depending on implementation details.

The SAR sequencer 315 uses the output of the Flash ADC 370 to set the switches 318 for the already-encoded MSB(s) at the start of the SAR sequence to reduce the voltage Vd presented to the comparator. Reducing the maximum Vd voltage to the comparator minimizes current loss through the top plates of the capacitors of the capacitors 316. Embodiments of the invention perform this by using the information from the Flash ADC 370 to couple the bottom plates of the MSB capacitors C[7], Cn[7], and if two MSB are encoded by the Flash ADC, capacitors C[6], Cn[6] to appropriate reference voltages to minimize the Vd voltage at the start of the SAR sequence. Recall from above that the standard process in successive approximation is to couple all of the bottom plates of the capacitors in the capacitor array 316 to Vcm 363. Embodiments of the invention, however, only couple the bottom plates of the capacitors 316 of the remaining LSBs to Vcm 363, and instead couple the bottom plates of the capacitors 316 of the MSB(s) to Vrefp 364 or Vrefn 365 according to the bits already encoded by the Flash ADC 370.

Another benefit to using the Flash ADC 370 as described above is that the successive approximation process can start with the $2^{nd}$-most or $3^{rd}$-most significant bit, depending on how many bits are being encoded by the Flash ADC. For example, if the Flash ADC 370 is encoding the two MSBs, then the successive approximation may begin with the capacitors C[5] and Cn[5] of the capacitor array 316, because the encoding is already known for capacitors C[6], Cn[6], C[7] and Cn[7] from the output of the Flash ADC.

Figure 4:
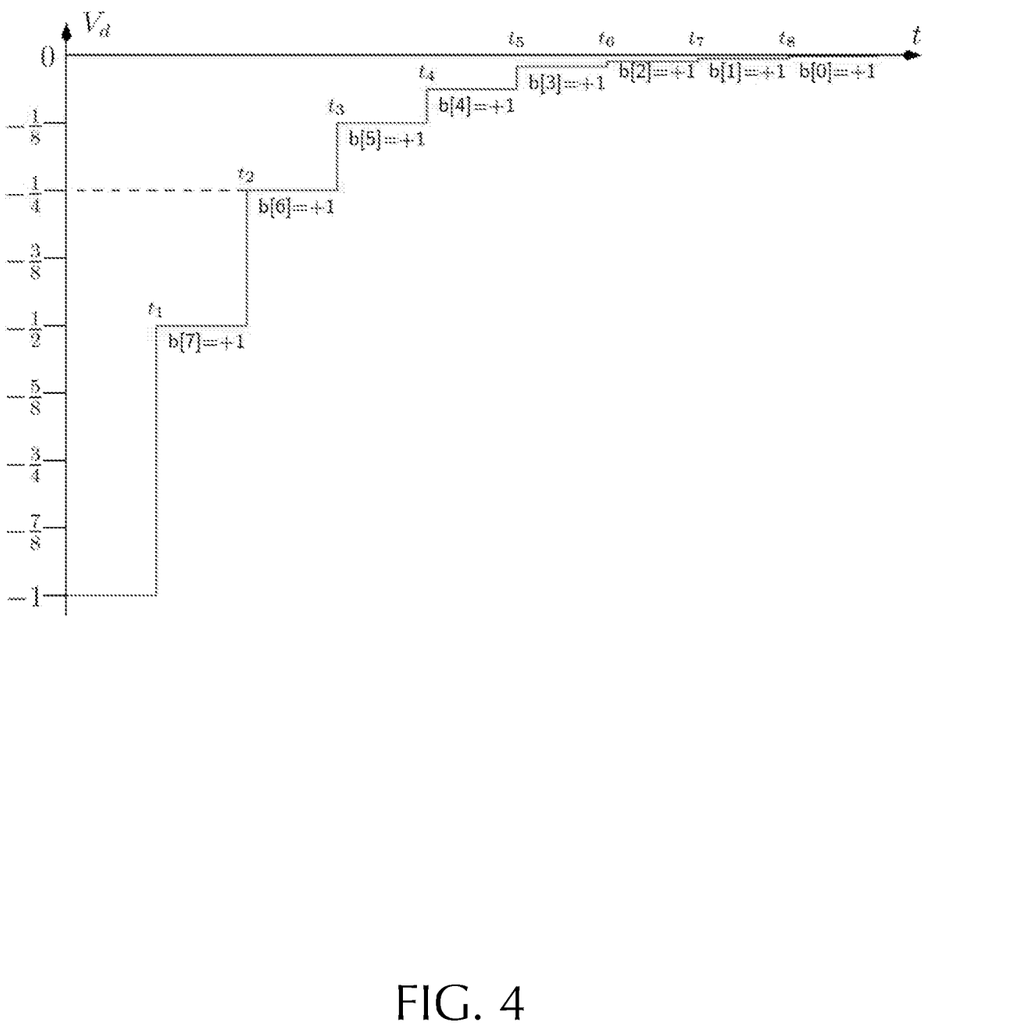
FIG. 4 is a plot of voltage vs. time illustrating a maximum voltage on capacitor plates within the hybrid SAR ADC of FIG. 3 at particular time intervals.

By using embodiments of the invention, which combine the use of a Flash ADC with a SAR ADC, the maximum differential voltage between the top plates of the capacitor array 316 is no longer the peak allowable signal level, because a large amount of the charge on the largest capacitors is canceled by the reference charge applied to those capacitors at the start of the successive approximation process. In the example described above, where two bits, b[7:6], are coded by the Flash ADC 370, then the large differential voltage between the top plates of the capacitors of the capacitor array is avoided because the two MSBs do not need to be approximated using the SAR process. FIG. 4 illustrates that, instead of a maximum Vd voltage of −1v, that the capacitor array may instead have a maximum Vd voltage of −¼v, as the successive approximation may begin at time t2, given that the encodings for the first two bits b[7:6] are already known from having been generated by the Flash ADC 370. So, not only does the SAR ADC 300 of FIG. 3 work faster than other known methods, there is less current leakage because the maximum voltage of the top plates of the capacitors in the capacitor network 316 is less or much less than it is in standard SAR ADCs. Another benefit is that the sampling charge initially stored in the capacitor network 316 may be largely preserved during the successive approximation process. This results in decreased conversion distortion as well as improved comparator noise performance.

The SAR ADC 300 illustrated in FIG. 3 may further support a non-binary weighted SAR architecture, because a decision error tolerance due to bit radix is less than 2. For example, when the radix between an adjacent bit is R, or $C_{k+1}/C_k=R$, then $C_k=R^k C_0$ where $C_0$ is the LSB capacitance, $C_{k+1}$ is the capacitance of capacitor k+1, $C_k$ is the capacitance of capacitor k, etc. Error tolerance of bit k−1, denoted as b[k−1] is described by equation 1:

$$E_{k-1} = \frac{R^{k-1} + R - 2}{R^n - 1},\qquad\text{Equation 1}$$

where $E_{k-1}$ is the error tolerance of bit k−1, R is the radix of corresponding bits as denoted by superscript, and n is a desired number of digital bits in the digital value. Further, the bit weight of bit k, denoted as b[k], is described by equation 2:

$$W_k = \frac{R^k (R-1)}{R^n - 1},\qquad\text{Equation 2}$$

where $W_k$ is the bit weight of bit k and other variables are as discussed above. As long as the attenuated error is less than decision error tolerance $E_k$, errors in the comparator decisions do not lead to a conversion error since the decision error for bit[k] can be recovered by bit[k−1:0] decisions later. The ability for the algorithm to recover from decision errors relaxes the noise, settling and accuracy requirements of the comparator 312, the capacitor network 316, and the Flash ADC 370.

In an example embodiment, the radix between adjacent bits in the SAR ADC 300 is 1.8. To maintain consistency, the radix of the Flash ADC 370 is also set to 1.8. This may be accomplished, for example, by using non-identical resistance values in the resistance ladder of the Flash ADC 370. In other embodiments, instead of having a fixed radix between every bit of the SAR ADC 300, the radix may vary from bit to bit. In such embodiments, the radix may even be above 2 between some bits so long as other bits have a radix less than 2 radix relative to their adjacent bits. The Flash ADC 370 would likewise have the same radix as the radix of the capacitor array 316.

Including a non-binary weighted progression for capacitor size in the SAR ADC 300 provides opportunity to calibrate or measure the individual capacitor weights. This calibration also affords an opportunity to correct some manufacturing defects or imprecise tolerances. For example, the SAR ADC 300 may include a calibration ADC coupled to the Vd and structured to measure the actual and/or relative capacitance (or relative weight) of each capacitor in the capacitor network 316. Then the SAR sequencer 315 and/or the SAR register 313 can compensate for any inconsistencies.

Further explanation of non-binary radix architecture and calibration structures appears in co-pending U.S. application Ser. No. 15/799,812 entitled DIGITALLY CALIBRATED SUCCESSIVE APPROXIMATION REGISTER ANALOG-TO-DIGITAL CONVERTER, which is assigned to the assignee of the present invention, and the teachings of which are incorporated by reference herein.

Figure 5:
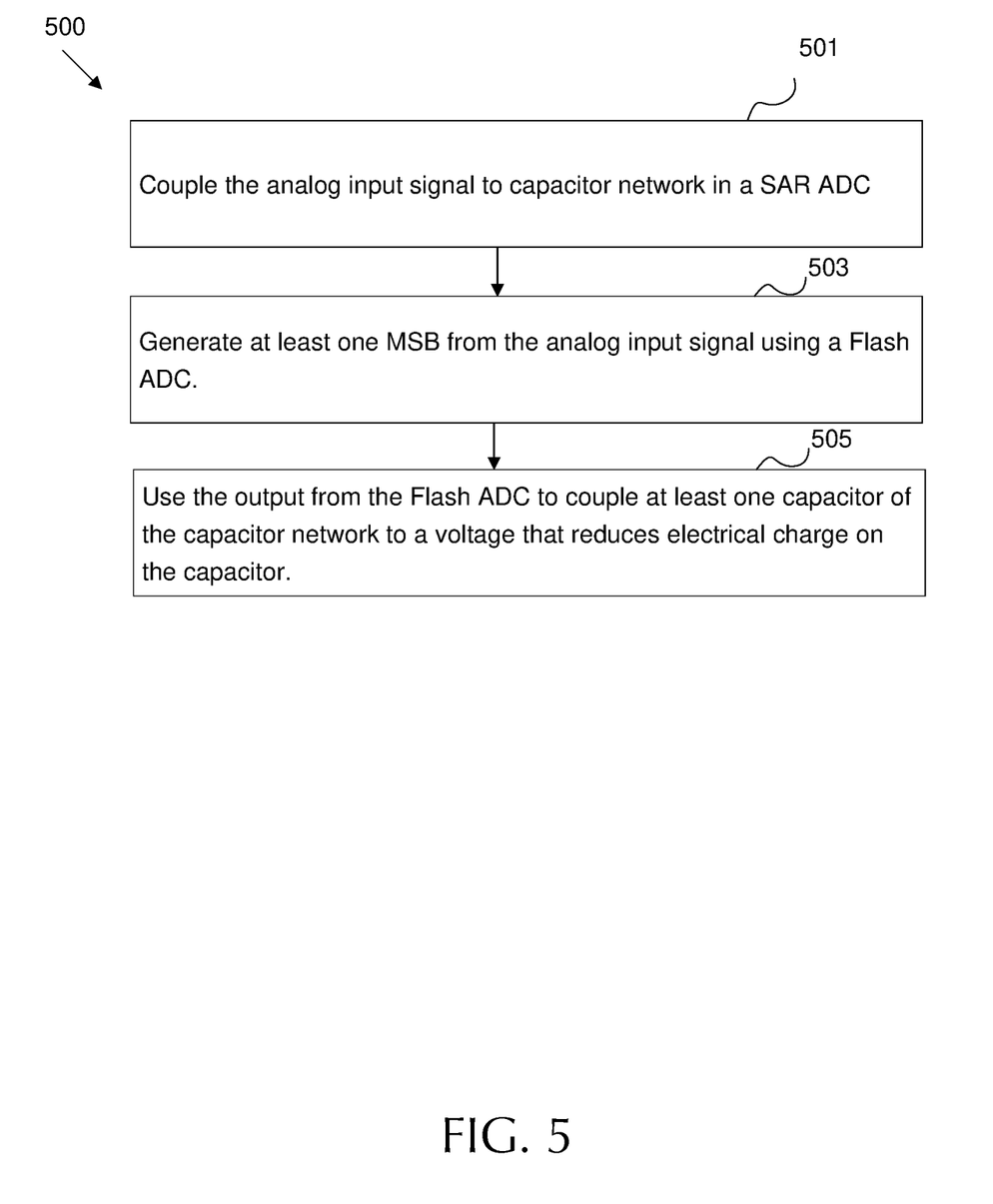
FIG. 5 is a flowchart of an example method of operating a hybrid SAR ADC according to embodiments of the invention.

A non-binary weighted SAR architecture uses a digital correction logic to add up the bit weights $W_k$ according to the bit decisions b[7:0] to construct the digital output value 362. In the example embodiment, each bit weights $W_k$ is measured by a calibration ADC coupled to the capacitor network top plate voltage Vd in a calibration procedure before the SAR ADC starts operation. This digital correction logic may appear in the SAR Register 313 of FIG. 3, or in another functional block coupled to the output of the SAR sequencer 315, for example. FIG. 5 is a flowchart of an example method 500 of operating a SAR ADC, such as the SAR ADC 300 of FIG. 3. At block 501, an analog input signal is coupled to a capacitor network in the SAR ADC as described above. For example, the capacitor array is coupled the Vinn and Vinp.

At block 503, at least one MSB of a digital signal is generated by a Flash ADC that is coupled to the same analog input signal as the capacitor network in block 501.

At block 505, the output from the Flash ADC is used to control a coupling device that couples at least one capacitor of the capacitor network to a voltage that reduces electrical charge on the capacitor. As described above, in one embodiment the SAR sequencer 315 uses the output of the Flash ADC 370 to control switches 318 of at least one of the capacitors in the capacitor array 316. Typically, the controlled capacitor will include at least the largest capacitor, which is also the MSB.

Examples of the disclosure may operate on a particularly created hardware, on firmware, digital signal processors, or on a specially programmed general purpose computer including a processor operating according to programmed instructions. The terms "controller" or "processor" as used herein are intended to include microprocessors, microcomputers, Application Specific Integrated Circuits (ASICs), and dedicated hardware controllers. One or more aspects of the disclosure may be embodied in computer-usable data and computer-executable instructions (e.g. computer program products), such as in one or more program modules, executed by one or more processors (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as Random Access Memory (RAM), Read Only Memory (ROM), cache, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer readable media excludes signals per se and transitory forms of signal transmission. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

We claim:

1. A successive approximation register analog to digital converter for use at an output of a microphone, said successive approximation register analog to digital converter comprising:
 a flash analog to digital converter structured to be selectively coupled to an analog signal input; and
 a successive approximation register sequencer configured to accept an output of the flash analog to digital converter and couple at least one capacitor of a capacitor array to a pre-defined voltage based on the output of the flash analog to digital converter.

2. The successive approximation register analog to digital converter of claim 1 further comprising a comparator having inputs and an output, the successive approximation register sequencer coupled to the comparator output, and the capacitor array coupled to an input of the comparator, the capacitor array coupled to and controlled by the successive approximation register sequencer to be selectively coupled to the analog signal input for converting the analog signal input to a digital output signal.

3. The successive approximation register analog to digital converter of claim 1 wherein the successive approximation register sequencer is configured to couple more than one capacitor of the capacitor array to the pre-defined voltage based on the output of the flash analog to digital converter.

4. The successive approximation register analog to digital converter of claim 2 wherein the capacitor array has a radix less than two.

5. The successive approximation register analog to digital converter of claim 2 wherein the capacitor array has a non-uniform radix between adjacent capacitors of the capacitor array.

6. The successive approximation register analog to digital converter of claim 1 wherein the flash analog to digital converter has a radix that matches the radix of the capacitor array.

7. The successive approximation register analog to digital converter of claim 1 further comprising a calibration analog to digital converter coupled to the inputs of the comparator, the calibration analog to digital converter structured to measure the capacitance of one or more capacitors in the capacitor array.

8. A semiconductor die assembly comprising:
 an output connection to a microphone mounted on a semiconductor die; and
 a successive approximation register analog to digital converter including a flash analog to digital converter structured to be selectively coupled to an analog signal input, and a successive approximation register sequencer configured to accept an output of the flash analog to digital converter and couple at least one capacitor of a capacitor array to a pre-defined voltage based on the output of the flash analog to digital converter, said successive approximation register analog to digital converter mounted on said semiconductor die.

9. The die assembly of claim 8 wherein the successive approximation register analog to digital converter further includes a comparator having inputs and an output, the successive approximation register sequencer coupled to the comparator output, and the capacitor array coupled to an input of the comparator, the capacitor array coupled to and controlled by the successive approximation register sequencer to be selectively coupled to the analog signal input converting the analog signal input to a digital output signal.

10. The die assembly of claim 8 wherein the successive approximation register sequencer is further configured to couple more than one capacitor of the capacitor array to the pre-defined voltage based on the output of the flash analog to digital converter.

11. The die assembly of claim 9 wherein the capacitor array has a radix less than two.

12. The die assembly of claim 9 wherein the capacitor array has a non-uniform radix between adjacent capacitors of the capacitor array.

13. The die assembly of claim 8 wherein the flash analog to digital converter has a radix that matches the radix of the capacitor array.

14. The die assembly of claim 8 wherein the successive approximation register analog to digital converter further includes a calibration analog to digital converter coupled to the inputs of the comparator, the calibration analog to digital converter structured to measure the capacitance of one or more capacitors in the capacitor array.

15. A successive approximation register analog to digital converter circuit assembly comprising:
a flash analog to digital converter structured to be selectively coupled to an analog signal input;
a successive approximation register sequencer configured to accept an output of the flash analog to digital converter and couple at least one capacitor of a capacitor array to a pre-defined voltage based on the output of the flash analog to digital converter; and
a comparator having inputs and an output, the successive approximation register sequencer coupled to the comparator output, and the capacitor array coupled to an input of the comparator, the capacitor array coupled to and controlled by the successive approximation register sequencer to be selectively coupled to the analog signal input for converting the analog signal input to a digital output signal.

16. A successive approximation register analog to digital converter circuit assembly comprising:
a flash analog to digital converter structured to be selectively coupled to an analog signal input; and
a successive approximation register sequencer configured to accept an output of the flash analog to digital converter and couple
more than one capacitor of the capacitor array to the pre-defined voltage based on the output of the flash analog to digital converter.

17. A successive approximation register analog to digital converter circuit assembly comprising:
a flash analog to digital converter structured to be selectively coupled to an analog signal input; and
a successive approximation register sequencer configured to accept an output of the flash analog to digital converter and couple at least one capacitor of a capacitor array to a pre-defined voltage based on the output of the flash analog to digital converter, the capacitor array having a radix less than two.

18. The successive approximation register analog to digital converter circuit assembly of claim 17 wherein the capacitor array has a non-uniform radix between adjacent capacitors of the capacitor array.

19. The successive approximation register analog to digital converter circuit assembly of claim 17 wherein the flash analog to digital converter has a radix that matches the radix of the capacitor array.

20. The successive approximation register analog to digital converter circuit assembly of claim 15 wherein the capacitor array has a non-uniform radix between adjacent capacitors of the capacitor array.

* * * * *